United States Patent
Racic

(10) Patent No.: US 10,506,709 B2
(45) Date of Patent: Dec. 10, 2019

(54) ELECTRONIC CIRCUIT

(71) Applicant: ZODIAC AEROTECHNICS, Plaisir (FR)

(72) Inventor: Zoran Racic, Paris (FR)

(73) Assignee: ZODIAC AEROTECHNICS, Plaisir (FR)

( * ) Notice: Subject to any disclaimer, the term of this patent is extended or adjusted under 35 U.S.C. 154(b) by 0 days.

(21) Appl. No.: 16/097,894

(22) PCT Filed: May 12, 2017

(86) PCT No.: PCT/FR2017/051161
§ 371 (c)(1),
(2) Date: Oct. 31, 2018

(87) PCT Pub. No.: WO2017/194899
PCT Pub. Date: Nov. 16, 2017

(65) Prior Publication Data
US 2019/0150277 A1 May 16, 2019

(30) Foreign Application Priority Data
May 13, 2016 (FR) ...................... 16 54275

(51) Int. Cl.
*H05K 1/02* (2006.01)
*H05K 1/14* (2006.01)

(52) U.S. Cl.
CPC ......... *H05K 1/0289* (2013.01); *H05K 1/0286* (2013.01); *H05K 1/144* (2013.01); *H05K 2201/09945* (2013.01)

(58) Field of Classification Search
CPC ................... H05K 1/0289; H05K 1/44; H05K 2201/09945; H05K 1/0286

(Continued)

(56) References Cited

U.S. PATENT DOCUMENTS 8,482,927 B2    7/2013  Caron et al.
2006/0236031 A1*  10/2006  Perego ................. G06F 13/409
                                                711/115

(Continued)

FOREIGN PATENT DOCUMENTS

EP    2 448 390       5/2012
JP    H07-221420      8/1995
JP    H08-221164      8/1996

OTHER PUBLICATIONS

International Search Report, PCT/FR2017/051161, dated Sep. 12, 2017.

(Continued)

*Primary Examiner* — Sherman Ng
(74) *Attorney, Agent, or Firm* — Young & Thompson

(57) ABSTRACT

An electronic circuit includes: a motherboard; an input/output connector including at least one group containing N input/output contacts; a set containing expansion slots having expansion contacts electrically connected to input/output contacts; each input/output contact being identified by an identifier T, each expansion slot being identified by an identifier S, each connected expansion contact being identified by an identifier R, for: each expansion slot of identifier S; and each connected expansion contact of identifier R. Each input/output contact of identifier T is electrically connected to a single expansion contact of identifier R of the expansion slot of identifier S, and the identifier T is calculated according to the following relation: T=[(R+D×S) modulo (N)], where D is fixed in each group and is an integer sub-multiple of the natural number N.

20 Claims, 6 Drawing Sheets

(58) Field of Classification Search
USPC .......................................................... 361/788
See application file for complete search history.

(56) References Cited

U.S. PATENT DOCUMENTS

| | | | | |
|---|---|---|---|---|
| 2006/0252285 | A1* | 11/2006 | Shen ..................... | G06F 13/409 |
| | | | | 439/43 |
| 2008/0104297 | A1* | 5/2008 | Lu ......................... | G06F 13/409 |
| | | | | 710/301 |
| 2012/0106114 | A1 | 5/2012 | Caron et al. | |
| 2013/0073768 | A1* | 3/2013 | Cong .................... | G06F 13/409 |
| | | | | 710/301 |
| 2013/0100627 | A1* | 4/2013 | Cong .................... | G06F 1/185 |
| | | | | 361/785 |
| 2013/0258629 | A1* | 10/2013 | Fu ......................... | G06F 1/185 |
| | | | | 361/785 |
| 2014/0004723 | A1 | 1/2014 | Costello | |
| 2015/0062797 | A1* | 3/2015 | Yin ....................... | G06F 1/185 |
| | | | | 361/679.32 |

OTHER PUBLICATIONS

Japanese Office Action for Application No. 2018-559956 dated Jun. 3, 2019 with English translation provided.

\* cited by examiner

ELECTRONIC CIRCUIT

BACKGROUND OF THE INVENTION

Field Of The Invention

The present invention falls within the field of managing the input/output data of electronic circuits.

In particular, the present invention relates to electronic circuits used in the field of aeronautics.

Description of the Related Art

In that field, every electronic circuit is specifically designed according to manufacturer requirements. Referring to FIG. 1, an electronic circuit 102 comprises for example a motherboard 104, an input/output connector 106, a main calculation unit 130, expansion slots 180, 181, and 182, and expansion cards 108. The input/output connector 106 has input/output contacts 110 able to receive/transmit input/output data. The expansion slots 180, 181 and 182 comprise expansion contacts 112 electrically connected to the input/output contacts 110. The expansion cards 108 are provided with contact pins 114 inserted into the expansion slots 180, 181, 182. Electronic components 116 are mounted on the expansion cards 108 and are electrically connected to the pins 114. The expansion cards 108 are developed to carry out a function within the electronic circuit, for example such as calculating the temperature or position. The results of the functions implemented by the expansion cards 108 are transmitted to the main calculation unit 130 by electrical connections.

When the aircraft manufacturer wants to add additional functionality to an existing electronic circuit or wants to modify a functionality, for example to adapt the circuit to a range of aircraft or simply to meet a specific order from a customer, the entire circuit board must be redeveloped, since in most cases the set of input/output contacts 110 is already connected to an expansion contact 112. When all expansion contacts 112 are already in use, a new motherboard 104 must be redeveloped. This development takes a long time. Development of an electronic circuit or expansion card is expensive.

BRIEF SUMMARY OF THE INVENTION

The purpose of the present invention is to design a circuit board having a standard architecture in which new functions can easily and quickly be implemented or in which functions can easily be modified.

To this end, the invention relates to an electronic circuit comprising:
a) a motherboard,
b) an input/output connector mounted on the motherboard, said input/output connector comprising at least one group containing N input/output contacts, N being a natural number greater than or equal to 2;
c) at least one set containing expansion slots mounted on the motherboard, each expansion slot of the at least one set having expansion contacts electrically connected to input/output contacts of the at least one group;

each input/output contact of the at least one group being identified by an identifier T, each expansion slot of the at least one set being identified by an identifier S, each connected expansion contact being identified by an identifier R, the identifiers T, R, and S being integers greater than or equal to 0;

characterized in that, for:
each expansion slot of identifier S of the at least one set, and
each connected expansion contact of identifier R,
each input/output contact of identifier T of the at least one group is electrically connected to a single expansion contact of identifier R of the expansion slot of identifier S of the at least one group, and in that
the identifier T of the input/output contact of the at least one group is calculated as a function of the R and S identifiers, according to the following relation:

$$T=[(R+D\times S) \text{ modulo } (N)]$$

where D is fixed in each group and is an integer submultiple of the natural number N.

Advantageously, the electronic circuit of the invention allows designing a circuit board and adapting this design throughout the development of electronic circuits for the aircraft.

Advantageously, an electronic circuit designed according to the invention can easily be adapted to different types of aircraft.

According to some particular embodiments, the electronic circuit comprises one or more of the following characteristics, alone or in combination:
it includes at least one expansion card comprising at least one electronic component and at least one contact pin electrically connected to said electronic component, said at least one contact pin being arranged at one end of the expansion card and inserted into at least one expansion contact of at least one expansion slot, and wherein the natural number D is less than or equal to said contact pin number.
wherein said at least one electronic component is connected to multiple contact pins, said contact pins being directly adjacent to one another.
wherein the expansion contacts are identified by identifiers in ascending order from left to right or from right to left, and wherein the expansion slot connected directly to the input/output connector, referred to as the first expansion slot, has an identifier S equal to 0, said expansion slot directly connected to said first expansion slot having an identifier S equal to 1.
wherein the identifier S varies between 0 and at least (N/D)−1.
wherein the natural number D is equal to 1.
wherein the natural number D is equal to 2.
wherein the natural number D is equal to 4.
wherein the input/output connector is integrated into the calculation unit.
it has at least two sets, the expansion contacts of a set being electrically connected to the input/output contacts of a group,
and wherein the expansion slots are arranged on the motherboard in a grid arrangement,
said expansion slots of a same set being aligned along a first straight line; at least two expansion slots of two different sets being aligned along a second straight line extending perpendicularly to the first straight line.
it has at least one expansion card inserted into at least one expansion slot, said expansion card extending perpendicularly to the motherboard.
it has at least one expansion card inserted into at least one expansion slot, said expansion card extending parallel to the motherboard.

BRIEF DESCRIPTION OF THE DRAWINGS

The invention will be better understood from reading the following description, given only as an example and with reference to the figures in which.

DETAILED DESCRIPTION OF THE PREFERRED EMBODIMENTS

Figure 1:
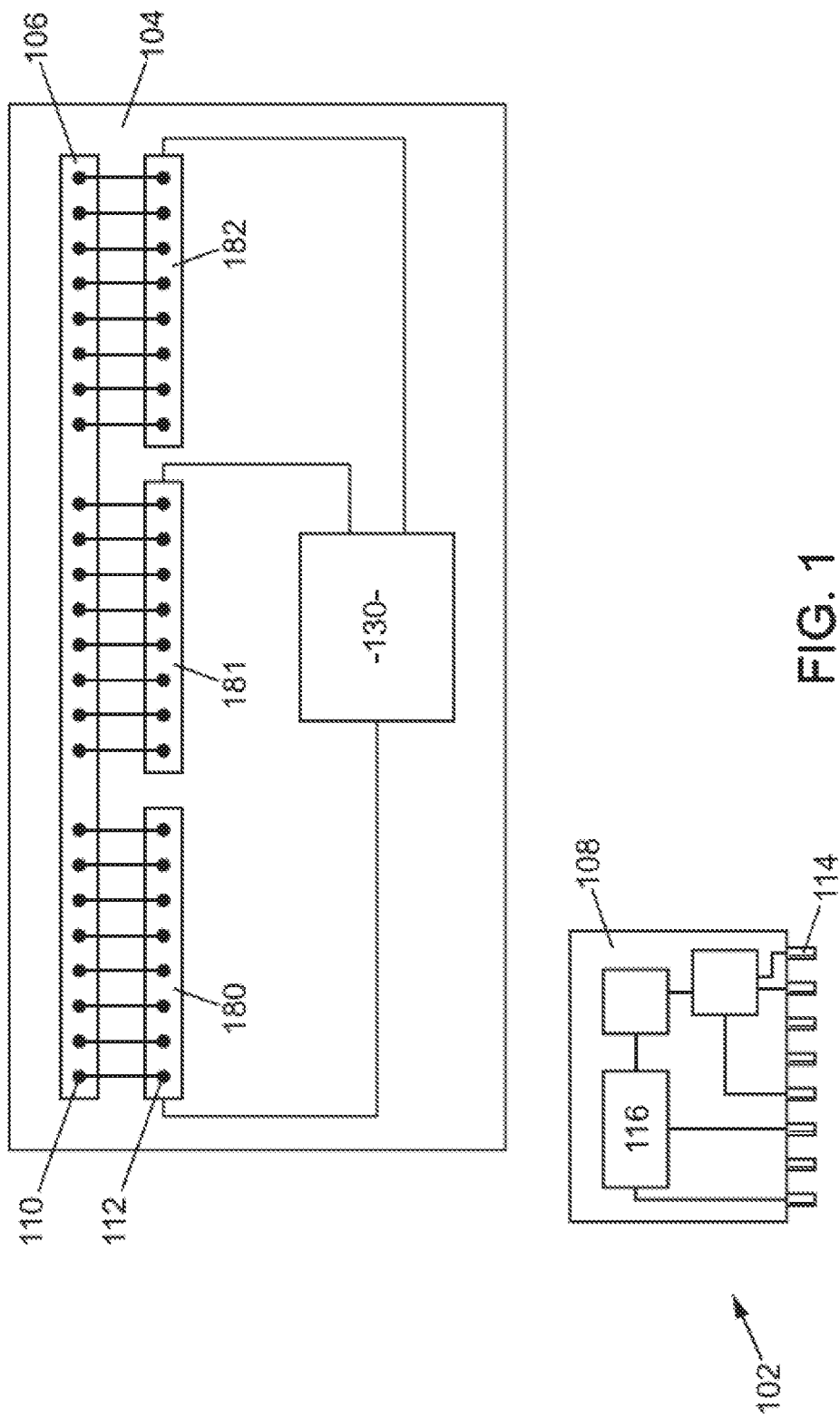
FIG. 1 is a schematic front view of an electronic circuit according to the prior art.
Figure 2:
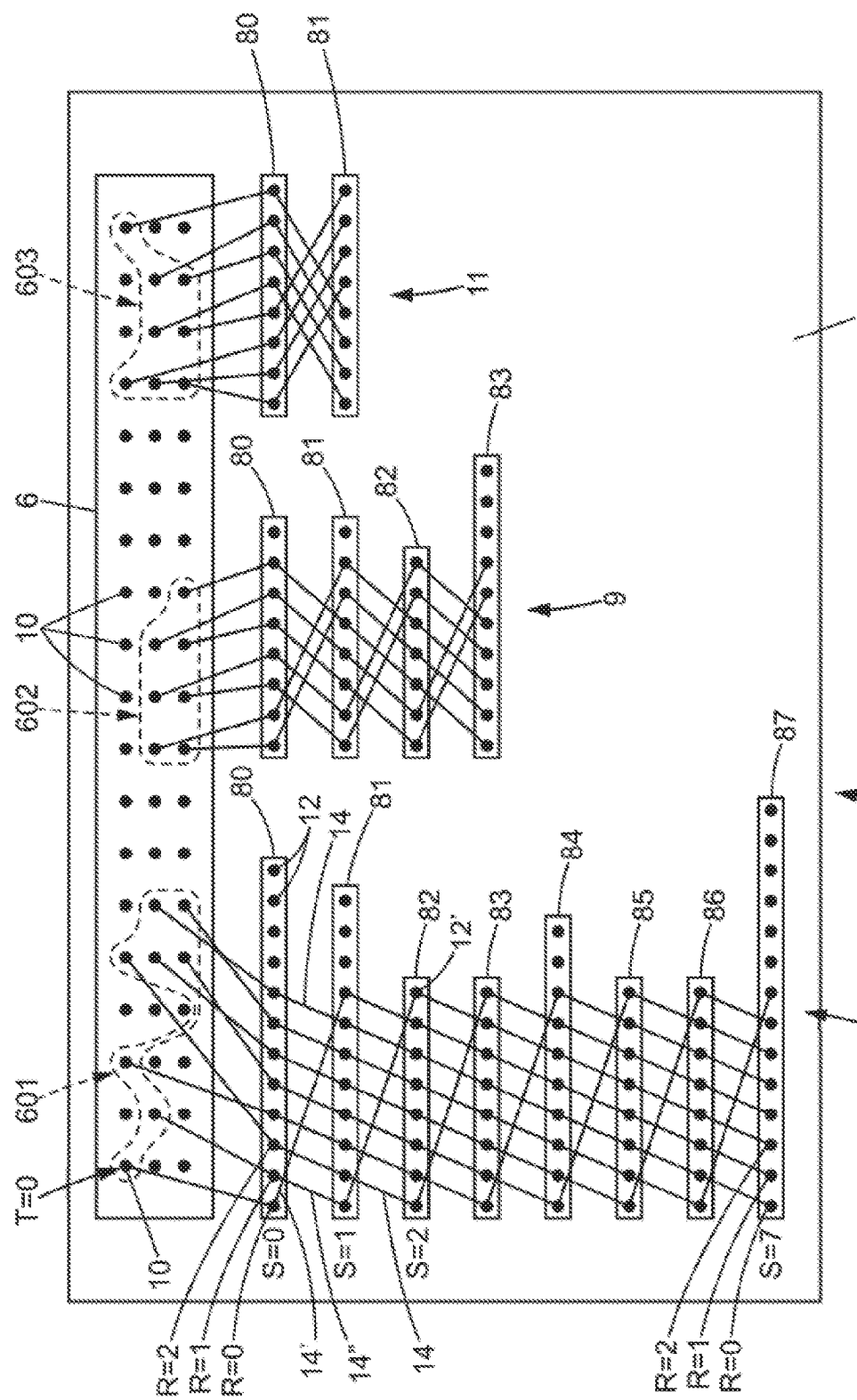
FIG. 2 is a schematic front view of a first exemplary electronic circuit according to the invention.

FIG. 2 shows an exemplary embodiment of the invention. This embodiment is in no way limiting.

Referring to FIG. 2, the electronic circuit 2 includes a motherboard 4, an input/output connector 6, and first 7, second 9, and third 11 sets of expansion slots 80 to 87 mounted on the motherboard 4.

The input/output connector 6 comprises first 601, second 602, and third 603 groups of input/output contacts 10. Each group comprises N input/output contacts. N is a natural number greater than or equal to 2.

For example, in the embodiment illustrated in FIG. 2, the first group 601 comprises eight input/output contacts 10. In the first group, the natural number N is equal to 8. The second group 602 comprises seven input/output contacts 10. The natural number N is therefore equal to 7 in the second group. The third group 603 comprises eight input/output contacts 10. The natural number N is equal to 8 in the third group.

For the present patent application, each input/output contact 10 of a group is identified by an identifier T. These T identifiers are integers greater than 0. In each group 601, 602, 603, the T identifiers start at 0, then incrementally increase by one. These are consecutive numbers. The assignment of T identifiers to the input/output contacts 10 of a group is independent of their location on the input/output connector 6.

The expansion slots 80 to 87 comprise expansion contacts 12. Each expansion slot 80 to 87 may have a different number of expansion contacts 12.

The expansion contacts 12 of the expansion slots 80 to 87 of a given set are electrically connected to the input/output contacts 10 of a group. Thus, in FIG. 2, the expansion contacts 12 of the expansion slots 80 to 87 of the first set 7 are electrically connected to the input/output contacts 10 of the first group 601. The expansion contacts 12 of the expansion slots 80 to 83 of the second set 9 are electrically connected to the input/output contacts 10 of the second group 602. Finally, the expansion contacts 12 of the expansion slots 80 and 81 of the third set 11 are electrically connected to the input/output contacts 10 of the third group 603.

In a same set 7, 9, 11, the expansion contacts 12 of an expansion slot 80 are connected to the expansion contacts 12 of a different expansion slot 81 by electrical connections 14.

For the present invention, the expansion slots 80 to 87 are identified by an identifier S. The expansion contacts 12 are identified by an identifier R. The R and S identifiers are integers greater than or equal to zero. The R identifiers start at zero, then incrementally increase by one. These are consecutive numbers.

Similarly, the S identifiers start at zero, then incrementally increase by one. The S identifiers are consecutive numbers. The S identifiers of the expansion slots of each set 7, 9, 11 are between 0 and (N divided by D)−1, where D is natural number that is fixed for each group and D is an integer sub-multiple of the natural number N. A sub-multiple is a number that can be divided exactly into a larger number.

For the purposes of the present invention, the expansion slot directly connected to the input/output connector 6 is identified with the lowest identifier, meaning the identifier equal to zero. It is referred to hereinafter as the first expansion slot 80. The first expansion slot 80 bears the identifier S=0.

The expansion slot 81 directly connected electrically to the first expansion slot 80 bears an identifier equal to the lowest identifier plus one. Here, the term "directly connected" means without intermediaries. Expansion slot 81 thus bears the identifier S=1. It is called the second expansion slot 81.

The expansion slot 82 directly connected to the second expansion slot 81 bears an identifier equal to the lowest identifier plus two. It bears the identifier S=2. In the present patent application, it is called the third expansion slot.

The other identifiers of the expansion slots of the first set 7 are assigned using the same rule.

Similarly, the identifiers of the expansion slots of the second set 9 are assigned using the same rule, such that the expansion slot 80 directly connected to the input/output connector 6 bears the identifier equal to zero. The expansion slot 81 electrically connected directly to the first expansion slot 80 bears the identifier S=1, and so on.

The R identifiers are assigned to the expansion contacts 12 of each expansion slot, from left to right, starting with the identifier equal to zero and ending with the highest identifier.

Thus, each expansion contact of an expansion slot is defined by a pair of identifiers comprising S and R. For example, the expansion contact denoted 12' in FIG. 2 is identified by the pair S=2 and R=8.

According to the present invention, for:
each expansion slot of identifier S of a set 7, 9, 11, and
each connected expansion contact of identifier R of this set 7, 9, 11,
  each input/output contact 10 of identifier T of a group 601, 602, 603 is electrically connected to only one expansion contact 12' of identifier R of the expansion slot of identifier S,
  and the identifier T of the input/output contact 10 of this group 601, 602, 603 is calculated as a function of the R and S identifiers according to the following relation:

$$T = [(R + D \times S) \text{ modulo } (N)] \quad (1)$$

where D is a natural number that is fixed for each group and D is an integer sub-multiple of the natural number N.

A connected expansion contact is an expansion contact electrically connected to another expansion contact or to an input/output contact.

This mathematical relation is achieved when the above-mentioned method for assigning identifiers is used.

In each set, each electrical connection 14, between two expansion slots identified by successive identifiers, crosses D or B-D other electrical connection(s) 14 between these same two expansion slots, where B is the connected expansion contact number.

In the first set 7, the number D is equal to one. Thus, the electrical connection 14' between the second expansion slot 81 and the third expansion slot 82 of the first set 7 crosses seven other electrical connections 14 between these slots 81, 82, and the electrical connection 14" between the first expansion slot 81 and the second expansion slot 82 of the first set 7 crosses another electrical connection between these slots 81 and 82 (in this case S=0, S=1, N=8, and D=1).

In the second set 9, the number D is equal to two.

In the third set 11, the number D is equal to four.

The electronic circuit 2 according to the present invention includes expansion cards 38, 40, 42 suitable for insertion into the expansion slots 80 to 87. The expansion cards 38, 40, 42 may be standard cards, for example with eight contact pins 44, as illustrated in FIG. 3.

According to the present invention, the electronic components 46, 48, 50 mounted on the expansion cards are connected to one or more end contact pins. When the electronic components of an expansion card are connected to multiple contact pins, the end pins connected to the electronic components are arranged consecutively one next to another.

Figure 3:
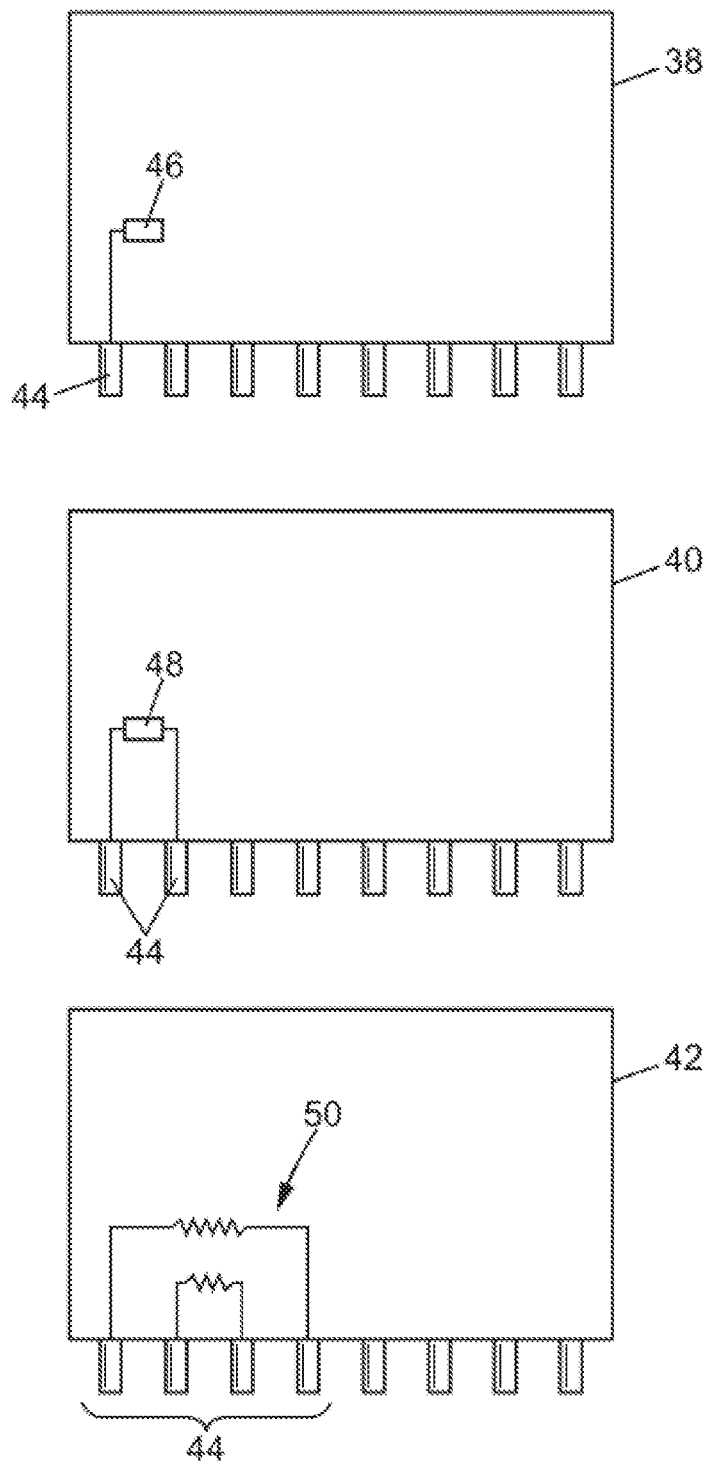
FIG. 3 is a schematic view of three expansion cards of the electronic circuit according to the present invention.

In the example illustrated in FIG. 3, the electronic components 46, 48, 50 are connected to the end contact pins 44 on the right. Alternatively, the electronic components are connected to the end contact pins on the left.

Expansion cards 38 having one or more electronic components connected to a single contact pin 44 are slotted in the set of expansion slots where D is equal to one. In the embodiment of FIGS. 2 and 3, expansion card 38 includes a discrete power signal generator 46 connected to a contact pin 44. This expansion card 38 is suitable for insertion into one of the expansion slots of the first set 7.

Expansion cards 40 having one or more electronic components connected to two contact pins are slotted in the group of expansion slots defined by D equal to two. In the embodiment of FIGS. 2 and 3, expansion card 40 includes a voltmeter 48 connected to two contact pins 44. Expansion card 40 is suitable for slotting in one of the expansion slots of the second set 9.

Finally, expansion cards 42 having one or more electronic components connected to four contact pins are slotted in the group of expansion slots defined by D equal to four. In the embodiment of FIGS. 2 and 3, expansion card 42 includes an electronic component 50 capable of a precision resistance measurement, connected to four contact pins 44. Expansion card 42 is suitable for slotting in one of the expansion slots of the third set 11.

The expansion cards may comprise electronic components connected to an odd number of contact pins. For example, when a potentiometer is mounted on an expansion card, three contact pins are connected to the potentiometer.

During development of the electronic board of the present invention, the developer chooses the natural number N as well as the natural number D associated with each set, based on the functions frequently used in aeronautics and on the number of contact pins that will be implemented for carrying out these functions.

For example, the developer may choose to create four sets, where D=0 (direct connections), D=1, D=2, and D=4.

The choice of D is based on the number of contact pins that will be connected in order to implement a function.

Thus, a set in which D=1 is created when it is known that there will be multiple functions or electronic components connected to a single contact pin 44. If it is believed that a large number of functions with a single pin is needed, a large N is chosen, for example N=8.

The number N is based on the number of pins available on the expansion card and the number of contact pins already used for other functions. Advantageously, the number N corresponds to the standard number of expansion slot contacts and the standard number of expansion card pins, in order to reduce production costs and delivery times.

For example, an electronic circuit can be designed with N=8, a first group with D=1, a second group with D=2, and a third group with D=4, such as the electronic circuit 2 shown in FIG. 2.

Alternatively, the R identifiers are assigned to the expansion contacts 12 of each expansion slot from right to left beginning with the lowest identifier and ending with the highest identifier.

This manner of implementing electrical connections allows modifying the functions implemented by the circuit board without having to completely redo the circuit board.

For example, the circuit board 4 is initially designed to receive four expansion cards 38 intended to be inserted into the first 80, second 81, third 82, and fifth 84 expansion slots of the first set 7.

The expansion card inserted into the first expansion slot 80 (S=0) processes the signals entering and/or exiting the expansion contact 12 identified as R=0. The expansion card inserted into the second expansion slot 81 (S=2) processes the signals entering and/or exiting the expansion contact identified as R=1. The signal received by the expansion contact 12 identified as R=0 and S=1 has not been used by the first expansion slot 80.

The expansion card inserted into the third expansion slot 82 (S=3) processes the signals entering and/or exiting the expansion contact identified as R=3. The expansion card inserted into the sixth expansion slot 85 processes the signals entering and/or exiting the expansion contact identified as R=0.

If the aircraft manufacturer wishes to add an additional function implemented by one or more electronic components connected to a contact pin, it can insert a new expansion card in the expansion slots identified as S=3, S=5, or S=6.

If the aircraft manufacturer wishes to remove an expansion card from a particular expansion slot, for example the expansion card inserted in the first expansion slot 80 of the first set, this change can be made without affecting the other expansion cards. In the case of such a removal, the input/output contact 10 identified as T=0 and the expansion contact identified as S=0 and R=0 are made available for the addition of a new expansion card.

Thus, advantageously, the removal of an expansion card does not result in the loss of a connection point on the input/output connector 6.

One or more expansion cards having two contact pins connected to electronic components may also be inserted into the expansion slots of the first set 7. However, in this case, the next expansion slot directly connected to this expansion slot cannot receive an expansion card.

For example, if a first expansion card 40 having two connected contact pins is inserted into the first expansion slot 80 (S=0), the signal received by the expansion contact identified as S=1 and R=0 is already defined according to the requirements of the expansion card inserted into the first expansion slot 80, so it cannot be used by an expansion card inserted into the second expansion slot 81 unless the latter slot uses the same signal as the signal supplied to the expansion contact identified as S=0 and R=1. Generally in such a case, a second expansion card is inserted into the third expansion slot 82 identified by S=2.

Figure 4:
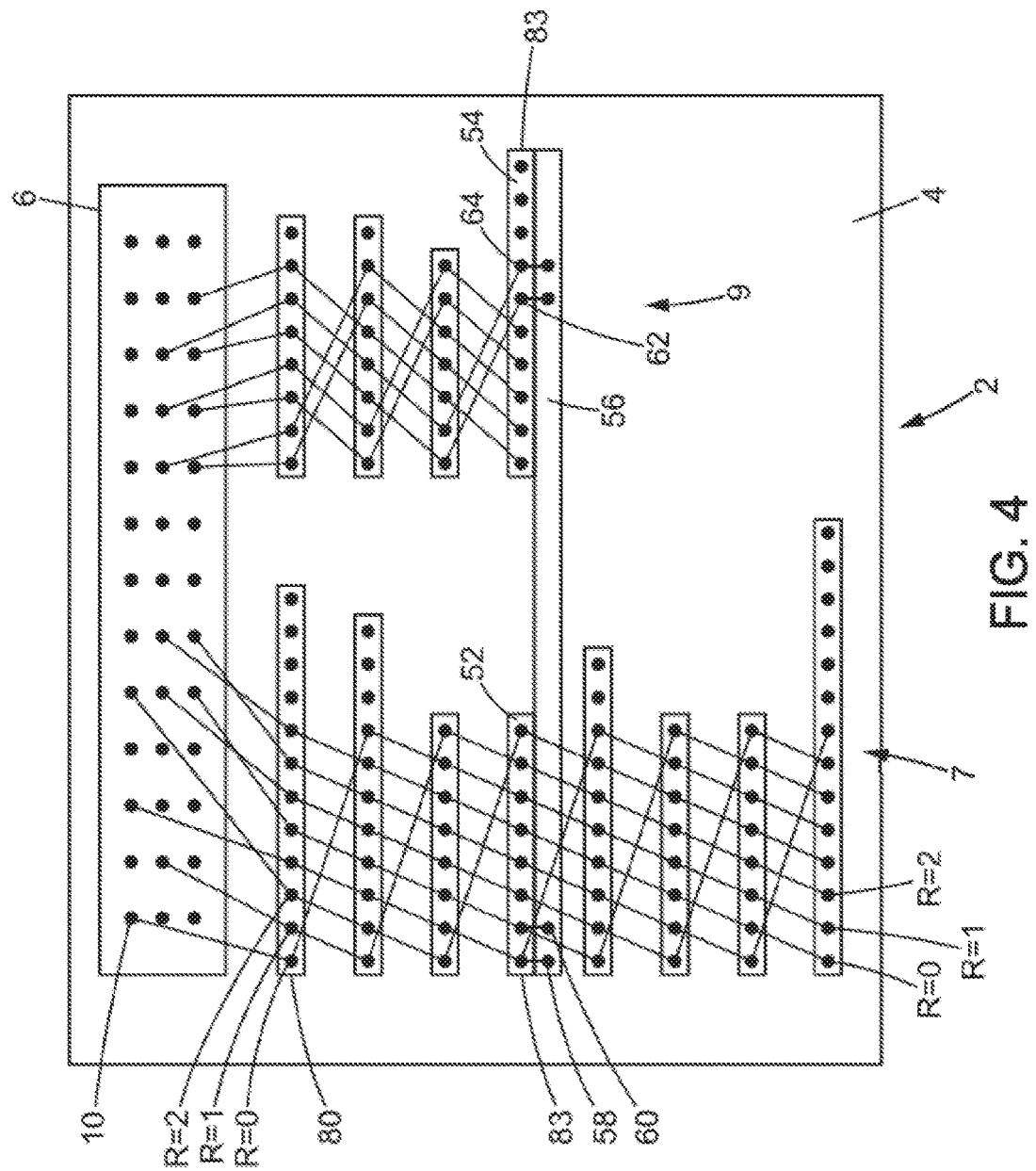
FIG. 4 is a schematic front view of the electronic circuit represented in FIG. 1 in which a function is implemented twice.

FIG. 4 shows a portion of the electronic circuit 20 when the circuit is used to implement a redundancy function. In this figure, an expansion card 52 is inserted into the fourth expansion slot 83 of the first set. The electronic components of the expansion card 52 are connected to expansion contacts 58, 60 identified as R=0 and R=1 of the expansion slot identified as S=3 of the first set. An expansion card 54 is plugged into the expansion slot 83 of the second set 9. The electronic components of this expansion card 54 are connected to the expansion contacts 62, 64 identified as R=5 and R=6 of the expansion slot identified as S=3 of the second set. Expansion cards 52 and 54 are able to implement the same function, for example a voltage measurement. An expansion card 56 is connected to the expansion contacts 58, 60 of the expansion slot of the first set, and to the expansion contacts 62, 64 of the expansion slot of the second set. This expansion card includes a first electrical connection electrically connecting expansion contact 58 to expansion contact 62, and a second electrical connection electrically connecting expansion contact 60 to expansion contact 64.

Thus, advantageously, there is redundancy in the voltage measurement carried out in expansion card 52 and expansion card 54 based on the same electrical signals, because expansion card 56 enables the transmission of data from one card to the other.

Advantageously, such a system simplifies the harness for implementing redundancy features. Indeed, the implementation of harnesses is expensive and error-prone.

Figure 5:
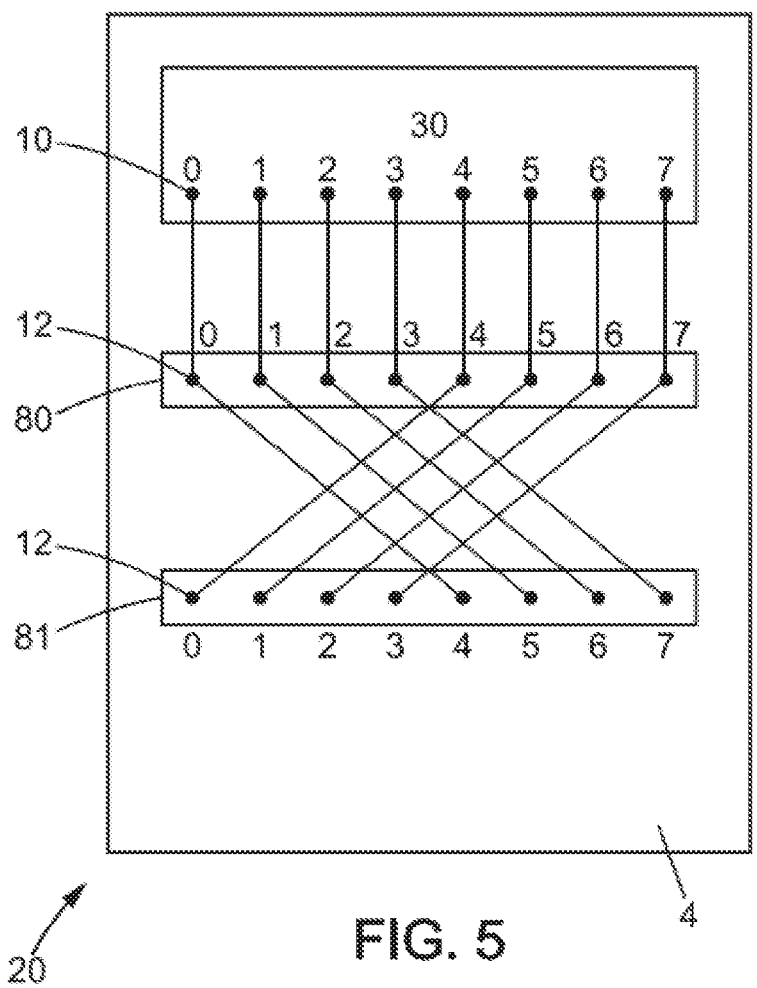
FIG. 5 is a schematic front view of an electronic circuit of a second exemplary electronic circuit according to the invention.

Referring to FIG. 5, another embodiment of an electronic circuit 20 according to the invention includes a motherboard 4, a main calculation unit 30, a first expansion slot 80, and a second expansion slot 81.

The calculation unit 30 includes eight input/output contacts 10 identified by T=0 to T=7. N is equal to 8.

The first expansion slot 80 is identified by the identifier S=0. It includes eight expansion contacts 12 identified from left to right by the identifiers R=0 to R=7.

The second expansion slot 81 is identified by the identifier S=1. It includes eight expansion contacts 12 identified from left to right by the identifiers R=0 to R=7.

According to this embodiment, Equation (1) describes the electrical connections between two expansion slots and the calculation unit 30. In the present patent application, we will say that the input/output connector is part of the calculation unit 30 or is integrated therewith.

The input/output contacts 10 of the calculation unit 30 are electrically connected to the expansion contact 12 of the first expansion slot 80 and second expansion slot 81 such that Equation (1) is satisfied, in this case with N=8 and D=4.

Figure 6:
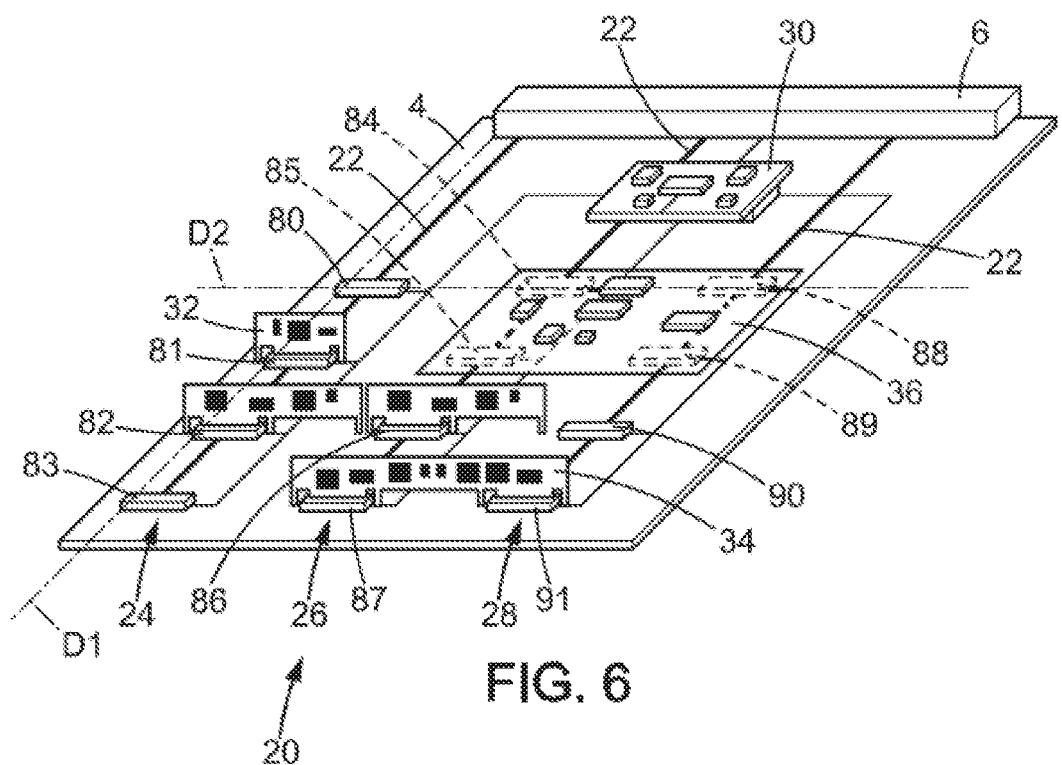
FIG. 6 shows a perspective view of a third exemplary electronic circuit according to the invention.

Referring to FIG. 6, a third example of an electronic circuit 20 according to the invention includes a motherboard 4, an input/output connector 6, three electrical input/output connections 22 connected to the input/output connector 6, and expansion slots 80 to 91 electrically connected to the electrical connections 22.

As with the first embodiment of the invention, the input/output connector 6 includes input/output contacts identified by the identifier T. These input/output contacts are not shown in FIG. 6.

The expansion slots 80 to 91 are bar-shaped sockets. The expansion slots 80 to 91 are identified by an identifier S.

The expansion slots 80 to 91 comprise expansion contacts identified by an identifier R. These expansion contacts are not shown in FIG. 6.

The electrical input/output connections 22 are able to transmit the input/output data between the input/output contacts of the input/output connector 6 and the expansion contacts of the expansion slots 80 to 91.

The electrical input/output connections 22 are formed on the mother board 4 so as to extend substantially parallel to one another.

In the embodiment shown, the electrical input/output connections 22 also extend perpendicularly to the input/output connector 6.

In the embodiment shown, four expansion slots 80, 81, 82, 83 are electrically connected to each other and to the input/output connector 6 by a first electrical connection 22. These four expansion slots 80, 81, 82, 83 form a first set 24.

Four expansion slots 84, 85, 86, 87 are electrically connected to each other and to the input/output connector 6 by a second electrical connection 22. These four expansion slots 84, 85, 86, 87 form a second set 26.

Similarly, four expansion slots 88, 89, 90, 91 are electrically connected to each other and to the input/output connector 6 by a third electrical connection 22. They form a third set 28.

According to the present invention, in each set, input/output contacts of identifier T are each electrically connected to an expansion contact of identifier R of an expansion slot of identifier S, with the T identifier satisfying Equation (1).

Advantageously, according to this embodiment, the expansion slots 80 to 91 are arranged on the motherboard 4 in a grid arrangement. Thus, the expansion slots 80, 81, 82, 83 of the first set are arranged in a first straight line D1. The first expansion slot 80 (slot directly connected to the input/output connector 6) of the first set 24, the first expansion slot 84 (slot directly connected to the input/output connector 6) of the second set 26, and the first expansion slot 88 of the third set 28 are aligned along a second straight line D2 perpendicular to the first straight line D1. Similarly, the third expansion slot 82 of the first set 24 (in other words the expansion slot directly connected to the first expansion slot 80), the second expansion slot 85 of the second set, and the second expansion slot 89 of the third set, are aligned along a line perpendicular to the first straight line D1.

The electronic circuit 20 further comprises a main calculation unit 30 such as a processor, expansion cards 32, 34, 36 connected to the expansion slots 80 to 91, and expansion connections 36 connecting the expansion slots 80 to 91 to the main calculation unit 30.

Expansion card 32 is inserted into expansion slot 81. It extends in a plane perpendicular to the main plane of the motherboard 4.

Expansion card 34 is inserted into two expansion slots 87 and 91 and extends between them. It extends in a plane perpendicular to the main plane of the motherboard 4.

Expansion card 36 is inserted into four expansion slots 84, 88, 85 and 89. It extends in a plane parallel to the main plane of the mother board 4. Male/female connectors are inserted between the expansion card 36 and the expansion slots 84, 88, 85, 89.

Advantageously, this circuit board can be used in the standard manner to implement different functions without requiring the fabrication of a new circuit board. The circuit board according to the invention can be adapted to implement different functions.

With the invention, it is no longer necessary to create a custom circuit board, in other words to predict in advance all the functions to be implemented and to create the circuit board based on all these functions.

The invention claimed is:

1. Electronic circuit comprising:
   a) a motherboard,
   b) an input/output connector mounted on the motherboard, said input/output connector comprising at least one group containing N input/output contacts, N being a natural number greater than or equal to 2;
   c) at least one set containing expansion slots (80 to 91) mounted on the motherboard, each expansion slot of the at least one set having expansion contacts electrically connected to input/output contacts of the at least one group;
   each input/output contact of the at least one group being identified by an identifier T, each expansion slot of the at least one set being identified by an identifier S, each connected expansion contact (12') being identified by an identifier R, the identifiers T, R, and S being integers greater than or equal to 0;
   characterized in that, for:
      each expansion slot of identifier S of the at least one set, and
      each connected expansion contact of identifier R,
   each input/output contact of identifier T of the at least one group is electrically connected to a single expansion contact of identifier R of the expansion slot of identifier S of the at least one set, and in that
   the identifier T of the input/output contact of the at least one group is calculated as a function of the R and S identifiers, according to the following relation:

$$T=[(R+D\times S)\bmod(N)]$$

where D is fixed in each group and is an integer submultiple of the natural number N.

2. Electronic circuit according to claim 1, including at least one expansion card comprising at least one electronic component and at least one contact pin electrically connected to said electronic component, said at least one contact pin being arranged at one end of the expansion card and inserted into at least one expansion contact of at least one expansion slot, and wherein the natural number D is less than or equal to said contact pin number.

3. Electronic circuit according to claim 2, wherein said at least one electronic component is connected to multiple contact pins, said contact pins being directly adjacent to one another.

4. Electronic circuit according to claim 1, wherein the expansion contacts are identified by identifiers in ascending order from left to right or from right to left, and wherein the expansion slot connected directly to the input/output connector, referred to as the first expansion slot, has an identifier S equal to 0, said expansion slot directly connected to said first expansion slot having an identifier S equal to 1.

5. Electronic circuit according to claim 1, wherein the identifier S varies between 0 and at least (N/D)−1.

6. Electronic circuit according to claim 1, wherein the natural number D is equal to 1.

7. Electronic circuit according to claim 1, wherein the natural number D is equal to 2.

8. Electronic circuit according to claim 1, wherein the natural number D is equal to 4.

9. Electronic circuit according to claim 1, wherein the input/output connector is integrated into the calculation unit.

10. Electronic circuit according to claim 1, having at least two sets, the expansion contacts of a set being electrically connected to the input/output contacts of a group,
    and wherein the expansion slots are arranged on the motherboard in a grid arrangement,
    said expansion slots of a same set being aligned along a first straight line; at least two expansion slots of two different sets being aligned along a second straight line extending perpendicularly to the first straight line.

11. Electronic circuit according to claim 1, having at least one expansion card inserted into at least one expansion slot, said expansion card extending perpendicularly to the motherboard.

12. Electronic circuit according to claim 1, having at least one expansion card inserted into at least one expansion slot, said expansion card extending parallel to the motherboard.

13. Electronic circuit according to claim 2, wherein the expansion contacts are identified by identifiers in ascending order from left to right or from right to left, and wherein the expansion slot connected directly to the input/output connector, referred to as the first expansion slot, has an identifier S equal to 0, said expansion slot directly connected to said first expansion slot having an identifier S equal to 1.

14. Electronic circuit according to claim 3, wherein the expansion contacts are identified by identifiers in ascending order from left to right or from right to left, and wherein the expansion slot connected directly to the input/output connector, referred to as the first expansion slot, has an identifier S equal to 0, said expansion slot directly connected to said first expansion slot having an identifier S equal to 1.

15. Electronic circuit according to claim 2, wherein the identifier S varies between 0 and at least (N/D)−1.

16. Electronic circuit according to claim 3, wherein the identifier S varies between 0 and at least (N/D)−1.

17. Electronic circuit according to claim 4, wherein the identifier S varies between 0 and at least (N/D)−1.

18. Electronic circuit according to claim 2, wherein the natural number D is equal to 1.

19. Electronic circuit according to claim 3, wherein the natural number D is equal to 1.

20. Electronic circuit according to claim 4, wherein the natural number D is equal to 1.

* * * * *